United States Patent
Yang et al.

(10) Patent No.: US 11,867,935 B2
(45) Date of Patent: Jan. 9, 2024

(54) OPTICAL INTERFERENCE FILTER

(71) Applicant: VIAVI Solutions Inc., San Jose, CA (US)

(72) Inventors: Jinhui Yang, Santa Rosa, CA (US); Marius Grigonis, Santa Rosa, CA (US); Georg J. Ockenfuss, Santa Rosa, CA (US); Karen Denise Hendrix, Santa Rosa, CA (US)

(73) Assignee: VIAVI Solutions Inc., Chandler, AZ (US)

( * ) Notice: Subject to any disclaimer, the term of this patent is extended or adjusted under 35 U.S.C. 154(b) by 0 days.

(21) Appl. No.: 17/449,149

(22) Filed: Sep. 28, 2021

(65) Prior Publication Data

US 2023/0097506 A1   Mar. 30, 2023

(51) Int. Cl.

| | |
|---|---|
| *G02B 5/28* | (2006.01) |
| *B32B 7/023* | (2019.01) |
| *B32B 7/02* | (2019.01) |
| *B32B 17/10* | (2006.01) |
| *C23C 14/00* | (2006.01) |
| *C23C 14/06* | (2006.01) |
| *C23C 14/34* | (2006.01) |
| *C23C 14/35* | (2006.01) |
| *G02B 5/20* | (2006.01) |

(52) U.S. Cl.
CPC ............... *G02B 5/285* (2013.01); *B32B 7/02* (2013.01); *B32B 7/023* (2019.01); *B32B 17/10229* (2013.01); *C23C 14/0036* (2013.01); *C23C 14/0617* (2013.01); *C23C 14/3464* (2013.01); *C23C 14/35* (2013.01); *G02B 5/207* (2013.01); *Y10T 428/24942* (2015.01); *Y10T 428/266* (2015.01)

(58) Field of Classification Search
None
See application file for complete search history.

(56) References Cited

U.S. PATENT DOCUMENTS

| | | | |
|---|---|---|---|
| 2014/0014838 A1 | 1/2014 | Hendrix et al. | |
| 2020/0209448 A1* | 7/2020 | Rowlands | ............... C23C 28/00 |
| 2020/0408976 A1* | 12/2020 | Kim | ........................ G02B 5/285 |

FOREIGN PATENT DOCUMENTS

| | | |
|---|---|---|
| EP | 3613870 A1 | 2/2020 |
| GB | 2138966 A | 10/1984 |
| WO | 2020204194 A1 | 10/2020 |

OTHER PUBLICATIONS

Co-pending U.S. Appl. No. 17/449,150, inventor Yang; Jinhui, filed on Sep. 28, 2021.
Co-pending U.S. Appl. No. 17/457,123, inventor Ockenfuss; Georg J., filed on Dec. 1, 2021.
Co-pending U.S. Appl. No. 17/821,606, inventors Yang; Jinhui et al., filed on Aug. 23, 2022.

(Continued)

*Primary Examiner* — Seth Dumbris
(74) *Attorney, Agent, or Firm* — Harrity & Harrity, LLP

(57) ABSTRACT

In some implementations, an optical interference filter includes a substrate; and a set of layers that are disposed on the substrate. The set of layers includes a first subset of layers, wherein the first subset of layers comprises an aluminum nitride (AlN) material; and a second subset of layers, wherein the second subset of layers comprises a hydrogenated silicon (Si:H) material.

20 Claims, 7 Drawing Sheets

(56) References Cited

OTHER PUBLICATIONS

Co-pending U.S. Appl. No. 17/931,323, inventors Yang; Jinhui et al., filed on Sep. 12, 2022.
Extended European Search Report for Application No. EP22198447.9, dated Feb. 10, 2023, 11 pages.

* cited by examiner

US 11,867,935 B2

OPTICAL INTERFERENCE FILTER

BACKGROUND

An optical device may be utilized to capture information concerning light. For example, the optical device may capture information relating to a set of wavelengths associated with the light. The optical device may include a set of sensor elements (e.g., optical sensors, spectral sensors, and/or image sensors) that capture the information. For example, an array of sensor elements may be utilized to capture information relating to multiple wavelengths. The array of sensor elements may be associated with an optical filter. The optical filter may include a passband associated with a first wavelength range of light that is passed to the array of sensor elements. The optical filter may be associated with blocking a second wavelength range of light from being passed to the array of sensor elements.

SUMMARY

In some implementations, an optical interference filter includes a substrate; and a set of layers that are disposed on the substrate. The set of layers includes a first subset of layers, wherein the first subset of layers comprises an aluminum nitride (AlN) material; and a second subset of layers, wherein the second subset of layers comprises a hydrogenated silicon (Si:H) material.

In some implementations, an optical interference filter includes a set of layers that includes a first subset of layers, wherein the first subset of layers comprises an AlN material; and a second subset of layers, wherein the second subset of layers comprises an Si:H material.

In some implementations, a method includes supplying an inert gas to a chamber, wherein the inert gas includes at least one of argon (Ar) or helium (He); supplying nitrogen ($N_2$) gas to the chamber; and causing, based on supplying the inert gas and the $N_2$ gas, sputtering of an aluminum (Al) target to form a first set of layers that comprise AlN on a substrate, wherein the first set of layers are formed on the substrate in alternation with a second set of layers that comprise Si:H.

DETAILED DESCRIPTION

Figure 1:
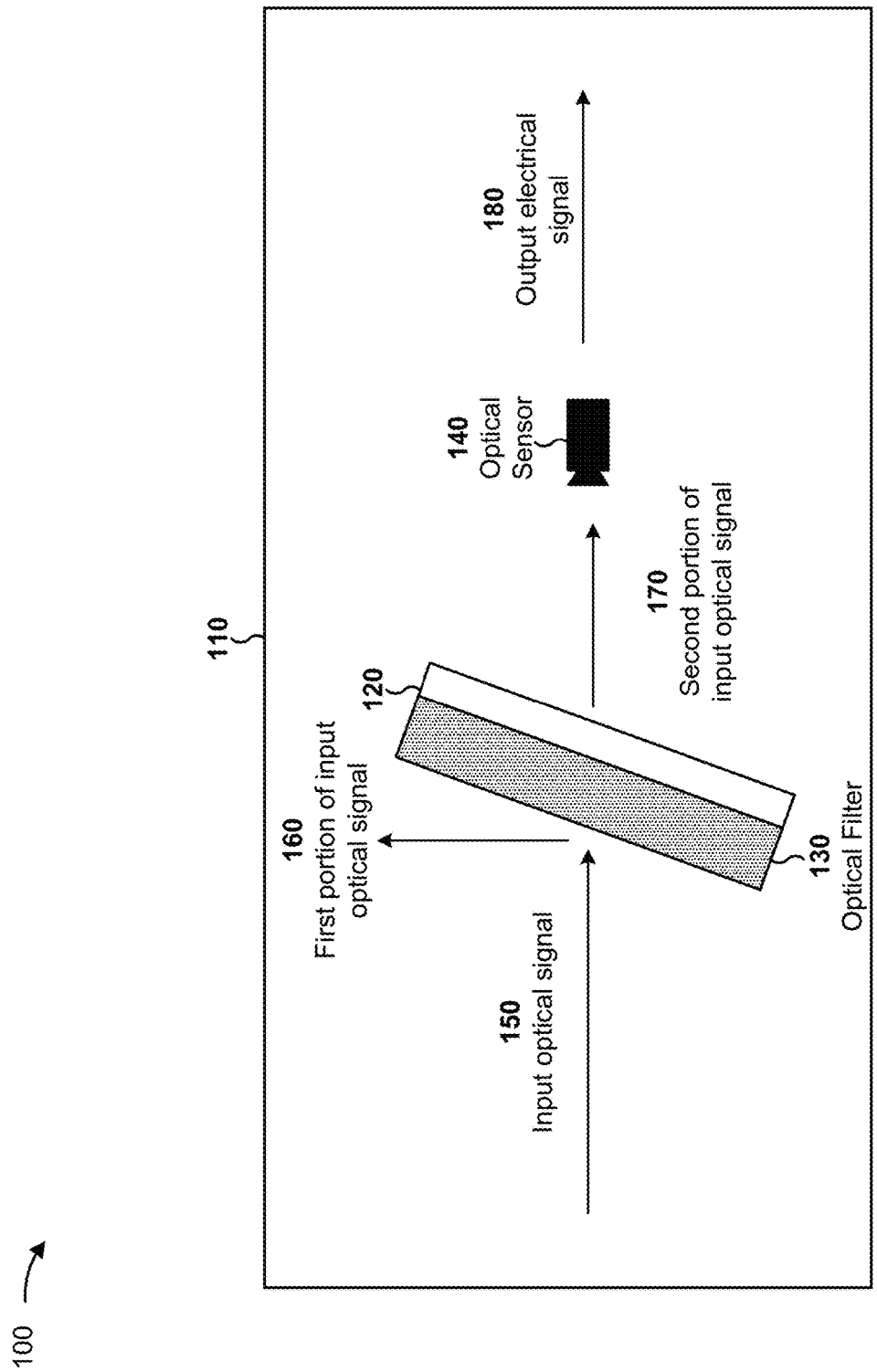
FIG. 1 is a diagram of an overview of an example implementation described herein.

The following detailed description of example implementations refers to the accompanying drawings. The same reference numbers in different drawings may identify the same or similar elements. The following description uses a spectrometer as an example. However, the techniques, principles, procedures, and methods described herein may be used with any sensor, including but not limited to other optical sensors and spectral sensors.

An optical filter may be manufactured by forming one or more layers on a substrate. For example, a conventional optical filter may include alternating layers of at least a first material, a second material, and a third material (e.g., alternating layers of a hydrogenated silicon (Si:H) material, a silicon dioxide ($SiO_2$) material, and a tantalum pentoxide ($Ta_2O_5$) material) to allow the conventional optical filter to pass a threshold percentage of light (e.g., at least 65% of light) associated with a particular spectral range (e.g., a spectral range of between 800 to 1000 nanometers (nm)). However, forming alternating layers of at least three materials is complex and can lead to formation of low quality layers, which introduces defects or allows defects to propagate through the conventional optical filter. This can degrade a performance, manufacturability, and/or a reliability of the conventional optical filter.

Further, in many cases, a stress of each of the layers of the one or more layers of the conventional optical filter is compressive (e.g., the stress of the layers is less than 0 megapascals (MPa)), which causes a stress (e.g., a net stress) of the one or more layers to be compressive. Consequently, this causes the conventional optical filter to bow (e.g., to bend). This causes the one or more layers to suffer from coating runoff, which affects a performance of the conventional optical filter. This also causes the conventional optical filter to be more fragile (e.g., as compared to a flat optical filter) and/or makes transporting, handling, and/or use of the conventional optical filter difficult.

Some implementations described herein provide an optical filter that includes a set of layers disposed on the substrate. The set of layers may include a first subset of layers that comprise an aluminum nitride (AlN) material and a second subset of layers that comprise a hydrogenated silicon (Si:H) material arranged in an alternating layer order. In some implementations, the optical filter passes a threshold percentage of light (e.g., at least 85% of light) associated with a particular spectral range (e.g., a spectral range of between 800 to 1000 nm). In this way, the optical filter provides an improved transmittance performance as compared to a conventional optical filter. Further, the optical filter includes just two alternating layers, which reduces a complexity associated with forming the set of layers. This reduces a likelihood of formation of low quality layers, and therefore reduces a likelihood of defects being introduced in or allowed to propagate through the optical filter. Therefore, a performance, manufacturability, and/or a reliability of the optical filter is improved as compared to that of a conventional optical filter.

In some implementations, a stress of the first subset of layers that comprise the AlN material may be between −1000 and 800 MPa. Accordingly, in some implementations, the stress of the AlN material may be configured to be tensile (e.g., greater than or equal to 0 MPa) when a stress of the second subset of layers is compressive, or vice versa. In this way, an amount of bowing caused by the set of layers disposed on the substrate may be minimized (e.g., by balancing a stress of compressive layers and a stress of tensile layers of the optical filter). For example, one of the first subset of layers and the second subset of layers may comprise tensile material and another of the first subset of layers and the second subset of layers may comprise compressive material, which may cause the stress of the set of layers to be approximately zero MPa (e.g., within a tolerance). This minimizes an amount of bowing of the optical filter, which reduces coating runoff and thereby improves a performance of the optical filter (e.g., as compared to a conventional optical filter that suffers from bowing). This also improves a durability of the optical filter and/or makes transporting, handling, and/or use of the optical filter easier as compared to a conventional optical filter that suffers from bowing.

FIG. 1 is a diagram of an overview of an example implementation 100 described herein. As shown in FIG. 1, example implementation 100 includes a sensor system 110. Sensor system 110 may be a portion of an optical system and may provide an electrical output corresponding to a sensor determination. Sensor system 110 includes an optical filter structure 120, which includes an optical filter 130, and an optical sensor 140. For example, optical filter structure 120 may include an optical filter 130 that performs a passband filtering functionality. In another example, an optical filter 130 may be aligned to an array of sensor elements of optical sensor 140.

Although some implementations, described herein, may be described in terms of an optical filter in a sensor system, implementations described herein may be used in another type of system, may be used external to a sensor system, or in other configurations.

As further shown in FIG. 1, and by reference number 150, an input optical signal is directed toward optical filter structure 120. The input optical signal may include but is not limited to light associated with a particular spectral range (e.g., a spectral range centered at approximately 900 nm, such as a spectral range of 800 nm to 1000 nm; a spectral range of 500 nm to 5500 nm; or another spectral range). For example, an optical transmitter may direct the light toward optical sensor 140 to permit optical sensor 140 to perform a measurement of the light. In another example, the optical transmitter may direct another spectral range of light for another functionality, such as a testing functionality, a sensing functionality, or a communications functionality, among other examples.

As further shown in FIG. 1, and by reference number 160, a first portion of the optical signal with a first spectral range is not passed through by optical filter 130 and optical filter structure 120. For example, dielectric filter stacks of dielectric thin film layers, which may include high index material layers and low index material layers of optical filter 130, may cause the first portion of light to be reflected in a first direction, to be absorbed, or the like. In this case, the first portion of light may be a threshold portion of light incident on optical filter 130 not included in a bandpass of optical filter 130, such as greater than 95% of light not within a particular spectral range centered at approximately 900 nm. As shown by reference number 170, a second portion of the optical signal is passed through by optical filter 130 and optical filter structure 120. For example, optical filter 130 may pass through the second portion of light with a second spectral range in a second direction toward optical sensor 140. In this case, the second portion of light may be a threshold portion of light incident on optical filter 130 within a bandpass of optical filter 130, such as greater than 50% of incident light in a spectral range centered at approximately 900 nm.

As further shown in FIG. 1, based on the second portion of the optical signal being passed to optical sensor 140, optical sensor 140 may provide an output electrical signal 180 for sensor system 110, such as for use in imaging, ambient light sensing, detecting the presence of an object, performing a measurement, or facilitating communication, among other examples. In some implementations, another arrangement of optical filter 130 and optical sensor 140 may be utilized. For example, rather than passing the second portion of the optical signal collinearly with the input optical signal, optical filter 130 may direct the second portion of the optical signal in another direction toward a differently located optical sensor 140.

As indicated above, FIG. 1 is provided as an example. Other examples may differ from what is described with regard to FIG. 1.

Figure 2:
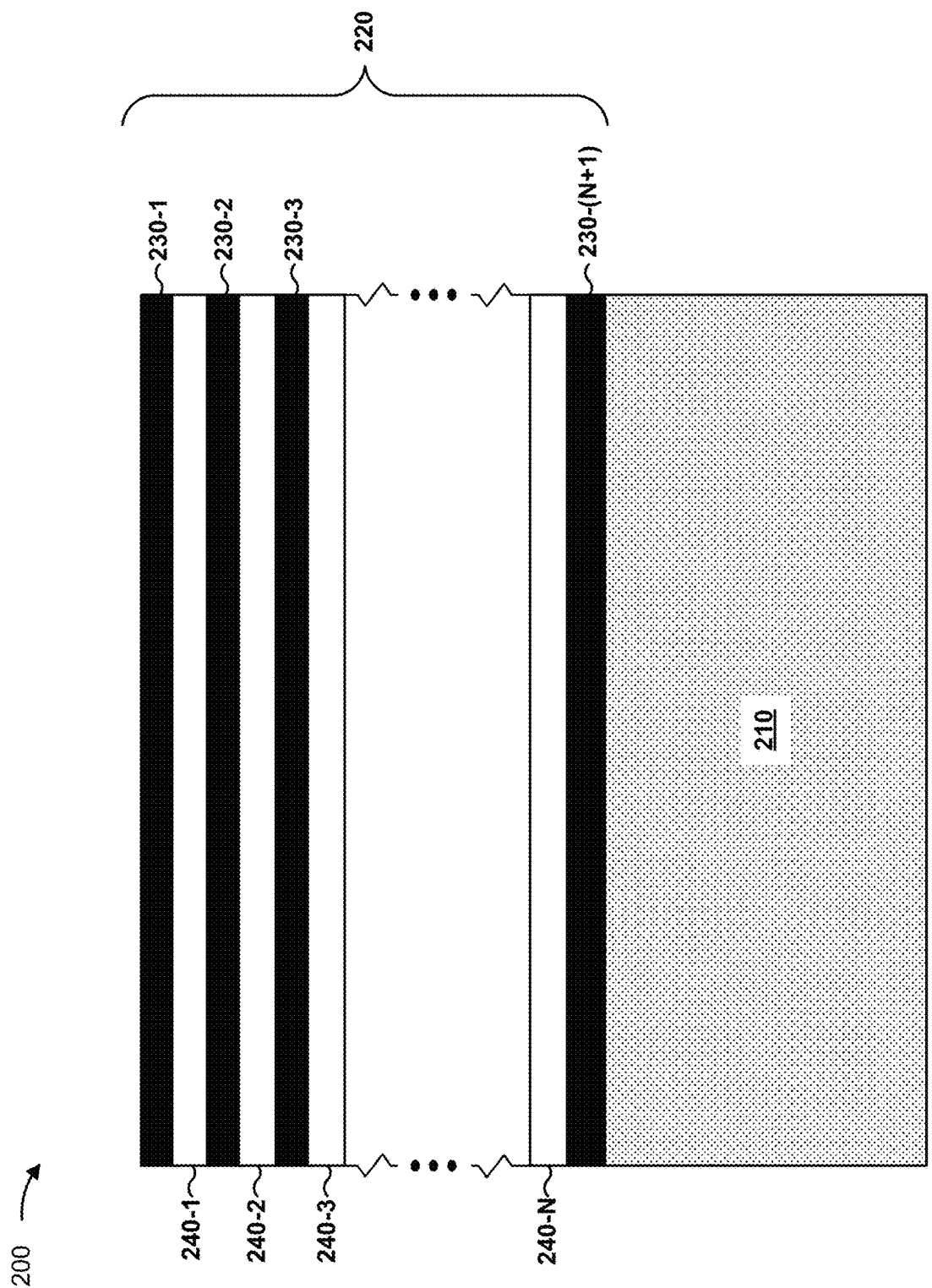
FIG. 2 is a diagram of an example optical filter described herein.

FIG. 2 is a diagram of an example optical filter 200. In some implementations, the optical filter 200 may be an optical interference filter and/or may comprise at least one of a spectral filter, a multispectral filter, a bandpass filter, a blocking filter, a long-wave pass filter, a short-wave pass filter, a dichroic filter, a linear variable filter, a circular variable filter, a Fabry-Perot filter, a Bayer filter, a plasmonic filter, a photonic crystal filter, a nanostructure or metamaterial filter, an absorbent filter, a beam splitter, a polarizing beam splitter, a notch filter, an anti-reflection filter, a reflector, or a mirror, among other examples. FIG. 2 shows an example stackup of the optical filter 200. As further shown in FIG. 2, the optical filter 200 includes a substrate 210 and a set of layers 220.

The substrate 210 may comprise a glass substrate, a polymer substrate, a polycarbonate substrate, a metal substrate, a silicon (Si) substrate, a germanium (Ge) substrate, or an active device wafer (e.g., that comprises a photodiode (PD), a PD array, an avalanche photodiode (APD), an APD array, a charge-coupled device (CCD) sensor, and/or a complementary metal oxide semiconductor (CMOS) sensor, among other examples). In some implementations, a thickness of the substrate 210 may be greater than or equal to 20 nanometers (nm), 50 microns (µm), and/or 500 µm. Additionally, or alternatively, the thickness of the substrate may be less than or equal to a particular thickness threshold. The particular thickness threshold, for example, may be less than or equal to 5000 microns.

The set of layers 220 (e.g., a set of optical filter layers) may be disposed on (e.g., directly on) the substrate 210 and may include one or more subsets of layers. For example, the set of layers 220 may include a first subset of layers 230 (e.g., a first subset of layers 230-1 through 230-(N+1) (N≥1)) (also referred to herein as A layers) and a second subset of layers 240 (e.g., a second subset of layers 240-1 through 240-N) (also referred to herein as B layers). In some implementations, the first subset of layers 230 and the second subset of layers 240 may be arranged in a particular order (e.g., an alternating layer order), such as an $(A-B)_m$ (m≥1) order, an $(A-B)_m$-A order, a $(B-A)_m$ order, a $B-(B-A)_m$ order, or another order. For example, as shown in FIG. 2, the first subset of layers 230 and the second subset of layers 240 are positioned in an $(A-B)_N$-A order with an A layer (e.g., layer 230-1) disposed at a surface (e.g., a top surface) of the optical filter 200 and an A layer (e.g., layer 230-(N+1)) disposed on a surface (e.g., a top surface) of the substrate 210.

In some implementations, the set of layers 220 may be disposed on a single surface (e.g., the top surface) of the substrate 210 (e.g., as shown in FIG. 2). Alternatively, a first portion of the set of layers 220 may be disposed on a first surface (e.g., the top surface) of the substrate 210, and a second portion of the set of layers 220 may be disposed on a second surface (e.g., a bottom surface) of the substrate 210. For example, a first portion of the first subset of layers 230 and a first portion of the second subset of layers 230 may be arranged in a first particular order on the first surface of the substrate 210, and a second portion of the first subset of layers 230 and a second portion of the second subset of layers 230 may be arranged in a second particular order on the second surface of the substrate 210.

In some implementations, one or more other layers may be included in the optical filter 200, such as one or more protective layers, one or more cap layers (e.g., to provide environmental protection to the set of layers 220), and/or one or more layers to provide one or more other filtering functionalities (e.g., a blocker or an anti-reflection coating, among other examples). For example, in a single surface configuration, an additional layer (e.g., a cap layer), such as a dielectric layer (e.g., that comprises an oxide material, such as a silicon dioxide ($SiO_2$) material, a zirconium dioxide ($ZrO_2$) material, and/or an yttrium oxide ($Y_2O_3$) material; a nitride material, such as a silicon nitride ($Si_3N_4$) material, a titanium nitride (TiN) material, and/or a zirconium nitride (ZrN) material; and/or another material that provides environmental protection), may be disposed on a surface (e.g., a top surface) of the set of layers 220. As another example, in a dual surface configuration, a first additional layer may be disposed on a surface (e.g., a top surface) of the first portion of the set of layers 220 and a second additional layer may be disposed on a surface (e.g., a bottom surface) of the second portion of the set of layers 220.

The first subset of layers 230 may comprise an aluminum nitride (AlN) material. For example, each layer 230, of the first subset of layers 230 may comprise an AlN material. The second subset of layers 240 may comprise at least one other material (e.g., at least one material other than an AlN material), such as at least one of a silicon (Si) material, a silicon and hydrogen (SiH) material, a hydrogenated silicon (Si:H) material, a hydrogenated silicon with helium (Si:H—He) material, an amorphous silicon (a-Si) material, a silicon nitride (SiN) material, a germanium (Ge) material, a hydrogenated germanium (Ge:H) material, a silicon germanium (SiGe) material, a hydrogenated silicon germanium (SiGe:H) material, a silicon carbide (SiC) material, a hydrogenated silicon carbide (SiC:H) material, a silicon dioxide ($SiO_2$) material, a tantalum pentoxide ($Ta_2O_5$) material, a niobium pentoxide ($Nb_2O_5$) material, a niobium titanium oxide ($NbTiO_x$) material, a niobium tantalum pentoxide ($Nb_2TaO_5$) material, a titanium dioxide ($TiO_2$) material, an aluminum oxide ($Al_2O_3$) material, a zirconium oxide ($ZrO_2$) material, an yttrium oxide ($Y_2O_3$) material, or a hafnium oxide ($HfO_2$) material, among other examples. For example, each layer 240, of the second subset of layers 240 may comprise at least one other material.

In some implementations, a stress (e.g., a net stress) of the first subset of layers 230 may between −1000 and 800 MPa (e.g., greater than or equal to −1000 MPa and less than or equal to 800 MPa). Additionally, or alternatively, a stress of each layer 230, of the first subset of layers 230, may be between −1000 and 800 MPa. That is, a stress of a particular layer 230, of the first subset of layers 230, may be between −1000 and 800 MPa and a stress of another particular layer 230, of the first subset of layers 230, may be between −1000 and 800 MPa. The stress of the particular layer 230 may be the same as, or different than, the stress of the other particular layer 230. For example, the stress of the particular layer 230 may be tensile (e.g., greater than or equal to 0 MPa) and the stress of the other particular layer 230 may be compressive (e.g., less than 0 MPa), or vice versa.

In some implementations, a stress (e.g., a net stress) of the set of layers 230 may be approximately zero (0) MPa (e.g., within a tolerance, wherein the tolerance is less than or equal to 5 MPa). Accordingly, at least one of the first subset of layers 230 and the second subset of layers 240 may comprise tensile material, and another of the first subset of layers 230 and the second subset of layers 240 may comprise compressive material (e.g., to cause the stress of the set of layers 230 to be approximately zero MPa). For example, the first subset of layers 230 may comprise a tensile material, and the second subset of layers 240 may comprise a compressive material, or vice versa. As another example, the first subset of layers 230 may comprise a tensile AlN material, and the second subset of layers 240 may comprise at least one compressive other material (e.g., at least one of a compressive Si material, a compressive Si:H material, a compressive Si:H—He material, or a compressive a-Si material, among other examples).

In some implementations, each layer of the set of layers 230 may be associated with a particular thickness. For example, a layer of the first subset of layers 230 or the second subset of layers 240 may have a thickness of between 5 and 2000 nm. In some implementations, the first subset of layers 230 or the second subset of layers 240 may be associated with multiple thicknesses, such as a first thickness for the first subset of layers 230 and a second thickness for the second subset of layers 240, a first thickness for a first portion of the first subset of layers 230 and a second thickness for a second portion of the first subset of layers 230, or a first thickness for a first portion of the second subset of layers 240 and a second thickness for a second portion of the second subset of layers 240, among other examples. Accordingly, a layer thickness and/or a quantity of layers may be selected based on an intended set of optical characteristics of the optical filter 200, such as an intended passband, an intended transmissivity, and/or another optical characteristic. For example, the layer thickness and/or the quantity of layers may be selected to permit optical filter 200 to be utilized for a spectral range of between 800 to 1000 nm (e.g., with a center wavelength of approximately 900 nm), a spectral range between 500 and 5500 nm, or another spectral range.

In some implementations, the set of layers 230 may be configured to pass a threshold percentage of light associated with a particular spectral range. For example, the set of layers 230 may be configured to pass a threshold percentage of light associated with a spectral range of between 800 and 1000 nm (e.g., with a center wavelength of approximately 900 nm). The threshold range, for example, may be greater than or equal to 85%. In some implementations, a refractive index of the first subset of layers 230 may be between 1.9 and 2.2 for light that has a wavelength that is between 500 and 5500 nm and/or a refractive index of the second subset of layers 240 may be between 3.5 and 3.9 for light that has a wavelength that is between 500 and 5500 nm. In some implementations, an extinction coefficient of the first subset of layers 230 may be less than 0.001 for light that has a wavelength that is between 500 and 5500 nm.

In some implementations, the set of layers 230 may be formed using a sputtering process. For example, the set of layers 230 may be formed using a magnetron sputtering process (e.g., a pulsed-magnetron sputtering process) to sputter the first subset of layers 230 and/or the second subset of layers 240 (e.g., in an alternating layer order) on the substrate 210. In this way, the optical filter 200 may be manufactured. Further details relating to manufacturing of the optical filter 200 are described herein in relation to FIG. 3.

As indicated above, FIG. 2 is provided as an example. Other examples may differ from what is described with regard to FIG. 2.

Figure 3:
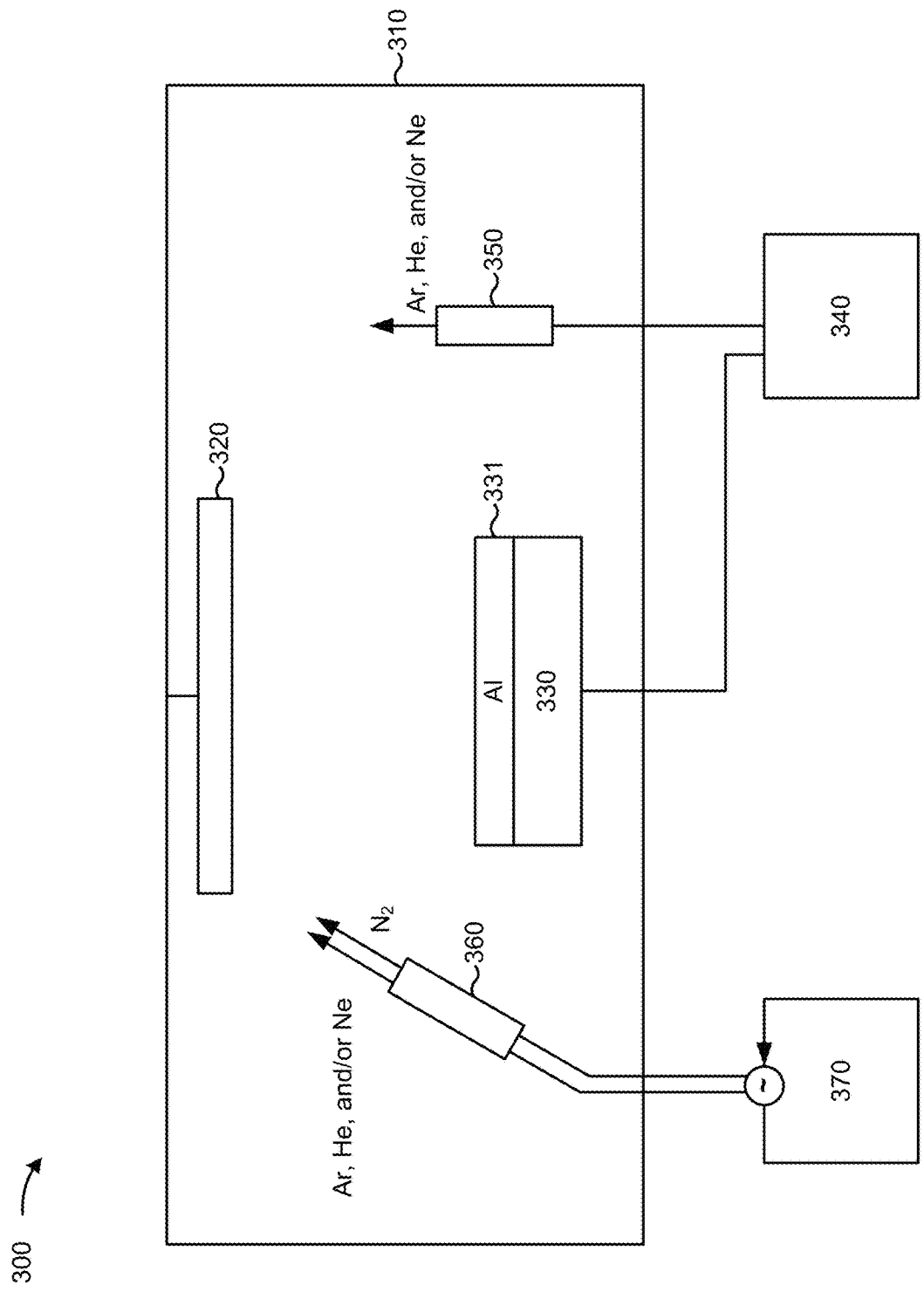
FIG. 3 is a diagram of an example of a sputter deposition system for manufacturing an optical filter described herein.

FIG. 3 is a diagram of an example 300 of a sputter deposition system for manufacturing an optical filter described herein (e.g., optical filter 200). The sputter deposition system may be used to enable a sputtering process, such as a magnetron sputtering process.

As shown in FIG. 3, example 300 includes a vacuum chamber 310, a substrate 320 (e.g., that corresponds to substrate 210 described herein in relation to FIG. 2), a cathode 330, a target 331, a cathode power supply 340, an anode 350, a plasma activation source (PAS) 360, and a PAS power supply 370. The target 331 may include an aluminum (Al) material. The PAS power supply 370 may be utilized to power the PAS 360 and may include a radio frequency (RF) power supply. The cathode power supply 340 may be utilized to power cathode 330 and may include a pulsed direct current (DC) power supply.

With regard to FIG. 3, the target 331 may be sputtered in the presence of nitrogen ($N_2$) gas and/or an inert gas (e.g., that includes argon (Ar), helium (He), and/or neon (Ne)) to deposit aluminum nitride (AlN) as at least one layer on the substrate 320. For example, the $N_2$ gas and the inert gas may each be supplied to the vacuum chamber 310, which may cause sputtering of the target 331 to form a first set of layers that comprise AlN on the substrate 320 (e.g., as further described herein). In some implementations, the first set of layers may be formed on the substrate in alternation with a second set of layers that comprise at least one other material, such as a second set of layers that comprises Si, Si:H, Si:H—He, a-Si, and/or any other material described herein (e.g., in relation to the second subset of layers 240 described herein in relation to FIG. 2). The second set of layers may be formed on the substrate (e.g., in a similar manner as further described herein) by supplying, for example, another gas (e.g., hydrogen ($H_2$) gas) and the inert gas (e.g., that includes Ar, He, and/or Ne) to the vacuum chamber 310 to cause sputtering of another target (e.g., a silicon target) to form the second set of layers (e.g., that comprise, in this example, Si:H).

To form an AlN layer, the inert gas may be provided into the vacuum chamber 310 via the anode 350 and/or the PAS 360. The $N_2$ gas may be introduced into the vacuum chamber 310 through the PAS 360, which serves to activate the $N_2$ gas. Additionally, or alternatively, the cathode 330 may cause the $N_2$ gas activation (e.g., in this case, the $N_2$ gas may be introduced from another part of the vacuum chamber 310) or the anode 350 may cause the $N_2$ gas activation (e.g., in this case, the $N_2$ gas may be introduced into the vacuum chamber 310 by the anode 350). The PAS 360 may be located within a threshold proximity of the cathode 330, allowing plasma from the PAS 360 and plasma from the cathode 330 to overlap. The use of the PAS 360 allows AlN to be deposited at a relatively high deposition rate. In some implementations, AlN may be deposited at a deposition rate of approximately 0.05 nm/s to approximately 2.0 nm/s, at a deposition rate of approximately 0.5 nm/s to approximately 1.2 nm/s, at a deposition rate of approximately 0.8 nm/s, or a similar rate.

In some implementations, a stress of an AlN layer (e.g., after formation) may be adjusted based on controlling a composition of the inert gas and/or an amount of the inert gas that is supplied to the vacuum chamber 310. For example, when the inert gas includes Ar, an amount of Ar in the inert gas and/or an amount of the inert gas supplied to the vacuum chamber 310 may be controlled to cause a stress of the AlN layer to be between −230 and 800 MPa. Additionally, or alternatively, when the inert gas includes Ar, an amount of Ar in the inert gas and/or an amount of the inert gas supplied to the vacuum chamber 310 may be controlled to cause a stress (e.g., a net stress) of the first set of layers that comprise AlN to be between −230 and 800 MPa. As another example, when the inert gas includes He and/or Ne, an amount of He and/or Ne in the inert gas and/or an amount of the inert gas supplied to the vacuum chamber 310 may be controlled to cause a stress of the AlN layer to be between −1000 and 150 MPa. Additionally, or alternatively, when the inert gas includes He and/or Ne, an amount of He and/or Ne in the inert gas and/or an amount of the inert gas supplied to the vacuum chamber 310 may be controlled to cause a stress of the first set of layers that comprise AlN to be between −1000 and 150 MPa.

Although the sputtering process is described, herein, in terms of a particular geometry and a particular implementation, other geometries and other implementations are possible. For example, the $N_2$ gas may be injected from another direction and/or from a gas manifold in a threshold proximity to the cathode 330, among other examples. Although described herein in terms of different configurations of components, different relative concentrations of AlN may also be achieved using different materials, different manufacturing processes, or the like.

As indicated above, FIG. 3 is provided as an example. Other examples may differ from what is described with regard to FIG. 3.

Figure 4A:
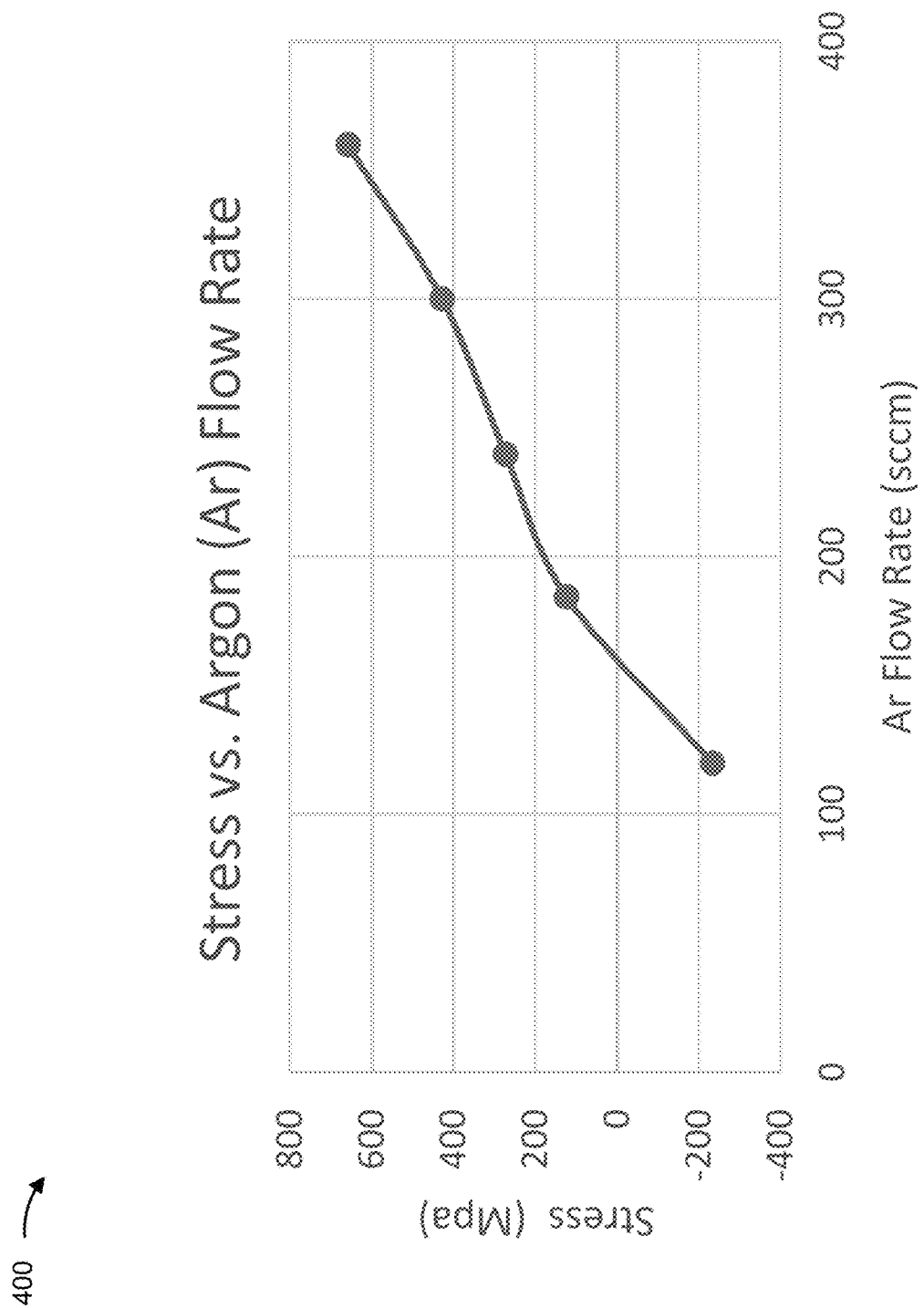
FIGS. 4A-4B are diagrams of example plots that show a stress of an AlN layer formed using a sputtering process described herein.
Figure 4B:
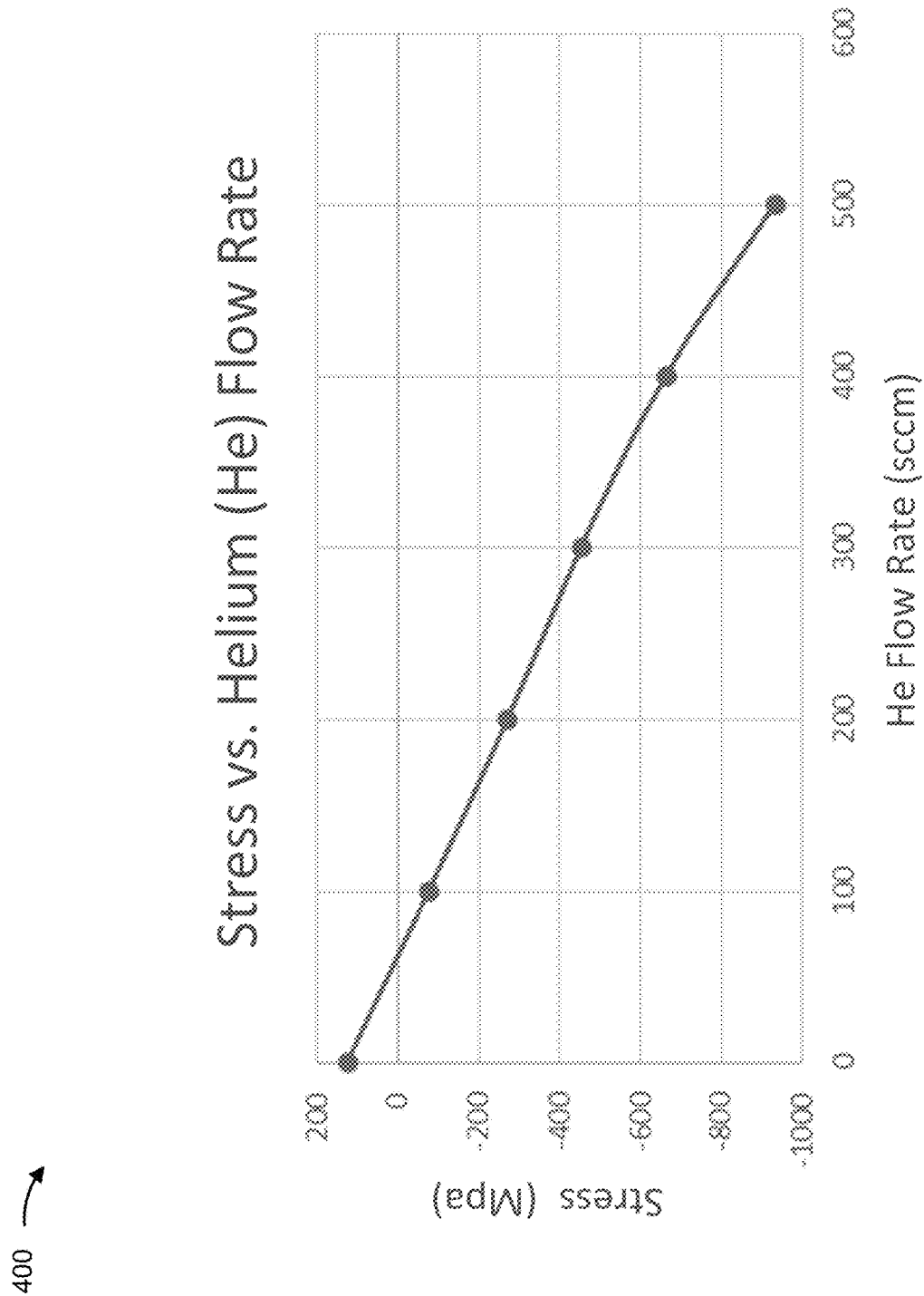

FIGS. 4A-4B are diagrams of example plots 400 that show a stress of an AlN layer formed using a sputtering process described herein (e.g., a magnetron sputtering process). As shown in FIG. 4A, a stress of an AlN layer may be configured to be between −230 and 650 MPa when an inert gas that includes Ar is supplied (e.g., to the vacuum chamber 310 of the sputter deposition system described herein in relation to FIG. 3) at a flow rate of between 120 and 370 standard cubic centimeters per minute (sccm). As shown in FIG. 4B, a stress of an AlN layer may be configured to be between −950 and 175 MPa when an inert gas that includes He is supplied (e.g., to the vacuum chamber 310 of the sputter deposition system described herein in relation to FIG. 3) at a flow rate of between 0 and 500 sccm.

As indicated above, FIGS. 4A-4B are provided as an example. Other examples may differ from what is described with regard to FIGS. 4A-4B.

Figure 5:
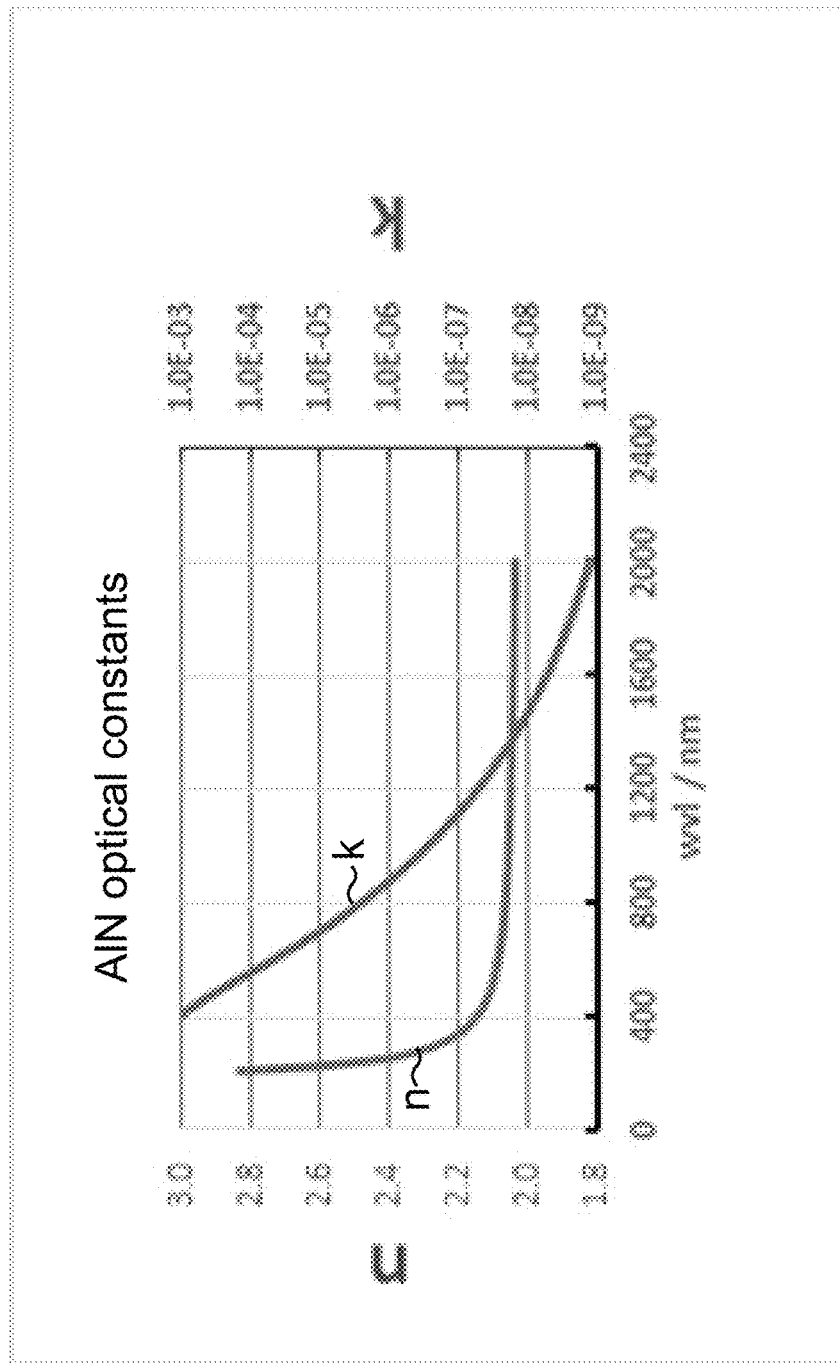
FIG. 5 is a diagram of an example plot of an extinction coefficient and a refractive index of a set of AlN layers formed using a sputtering process described herein.

FIG. 5 is a diagram of an example plot 500 of an extinction coefficient (k) and a refractive index (r) of a set of AlN layers formed using a sputtering process described herein (e.g., a magnetron sputtering process). As shown in FIG. 5, the extinction coefficient may be less than 0.001 for light that has a wavelength that is between 500 and 2000 nm. As further shown in FIG. 5, the refractive index may be less than 2.2 for light that has a wavelength that is between 500 and 2000 nm.

As indicated above, FIG. 5 is provided as an example. Other examples may differ from what is described with regard to FIG. 5.

Figure 6:
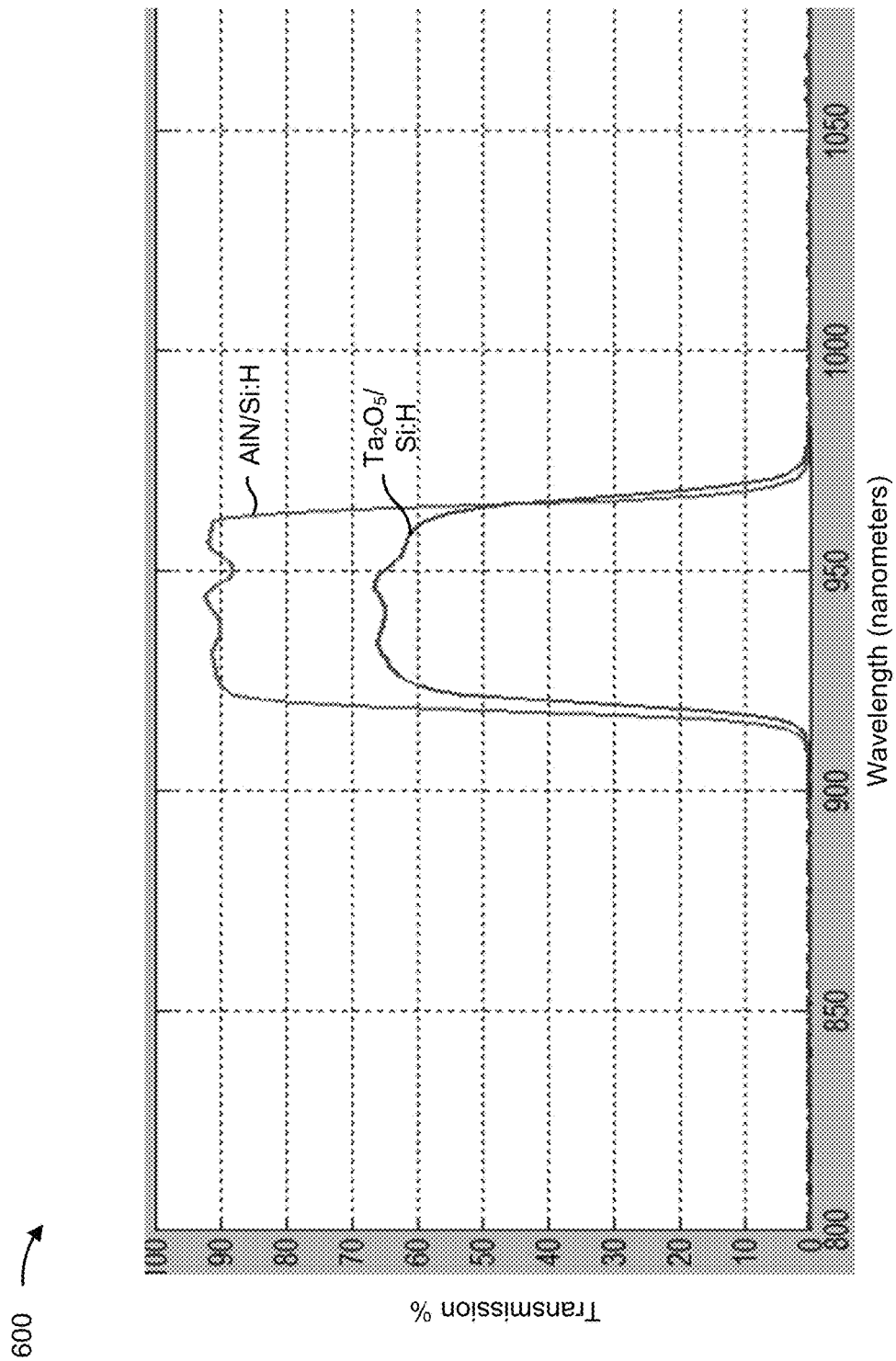
FIG. 6 is a diagram of an example plot that shows a transmittance performance of an optical filter described herein.

FIG. 6 is a diagram of an example plot 600 that shows a transmittance performance of an optical filter (e.g., the optical filter 200) described herein. The optical filter comprises a set of layers (e.g., the set of layers 220) that includes a first subset of layers (e.g., the first subset of layers 230) that comprise an AlN material and a second subset of layers (e.g., the second subset of layers 240) that comprise an Si:H material. As shown in FIG. 6, the optical filter may transmit greater than approximately 85% (with a peak of approximately 92%) of light that has a wavelength that is between 920 and 960 nm. In contrast, an alternative optical filter that comprises a set of layers that includes a first subset of layers that comprise a $Ta_2O_5$ material and a second subset of layers that comprise an Si:H material may transmit greater than approximately 60% (with a peak of approximately 67%) of light that has a wavelength that is between 920 and 960 nm. Accordingly, the optical filter described herein has an improved transmittance performance as compared to the alternative optical filter for the spectral range of between 920 and 960 nm.

As indicated above, FIG. 6 is provided as an example. Other examples may differ from what is described with regard to FIG. 6.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

As used herein, when a solution or material is referred to by a specific chemical name or formula, the solution or material may include non-stoichiometric variations of the stoichiometrically exact formula identified by the chemical name. For example, the aluminum nitride (AlN) material described herein may include $AlN_x$, where x is between 0.8 and 1.2.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical interference filter, comprising:
    a substrate; and
    a set of layers that are disposed on the substrate, wherein the set of layers includes:
        a first subset of layers,
            wherein the first subset of layers comprises a tensile aluminum nitride (AlN) material; and
        a second subset of layers,
            wherein the second subset of layers comprises a compressive hydrogenated silicon (Si:H) material.

2. The optical interference filter of claim 1, wherein a thickness of the substrate is greater than or equal to 50 microns.

3. The optical interference filter of claim 1, wherein the set of layers is configured to pass a threshold percentage of light associated with a spectral range of between 800 and 1000 nanometers, and wherein the threshold percentage of light is greater than or equal to 85%.

4. The optical interference filter of claim 1, wherein a refractive index of the first subset of layers is between 1.9 and 2.2 for light that has a wavelength that is between 500 and 5500 nanometers.

5. The optical interference filter of claim 1, wherein a refractive index of the second subset of layers is between 3.5 and 3.9 for light that has a wavelength that is between 500 and 5500 nanometers.

6. The optical interference filter of claim 1, wherein an extinction coefficient of the first subset of layers is less than 0.001 for light that has a wavelength that is between 500 nanometers and 5500 nanometers.

7. The optical interference filter of claim 1, wherein the set of layers are deposited on the substrate using a magnetron sputtering process.

8. The optical interference filter of claim 1, wherein the first subset of layers and the second subset of layers are disposed on the substrate in an alternating layer order.

9. The optical interference filter of claim 1, wherein an additional layer is disposed on the set of layers, and wherein the additional layer comprises a silicon dioxide (SiO2) material.

10. An optical interference filter, comprising:
a set of layers that includes:
a first subset of layers,
wherein the first subset of layers comprises a tensile aluminum nitride (AlN) material; and
a second subset of layers,
wherein the second subset of layers comprises a hydrogenated silicon (Si:H) material, and
wherein the Si:H material comprises compressive material.

11. The optical interference filter of claim 10, wherein a net stress of the set of layers is approximately zero megapascals.

12. The optical interference filter of claim 10, wherein a stress of the tensile aluminum nitride (AlN) material is between 0 and 800 megapascals.

13. A method, comprising:
supplying gas to a chamber; and
forming, based on supplying the gas, a set of layers of an optical interference filter,
wherein the set of layers includes:
a first subset of layers that comprise a tensile aluminum nitride (AlN), and
a second subset of layers that comprise a compressive hydrogenated silicon (Si:H) material.

14. The method of claim 13,
wherein the gas includes helium (He),
wherein the method further comprises:
supplying hydrogen (H2) gas to the chamber, and
wherein forming the set of layers comprises:
causing, based on supplying the gas and based on supplying the H2 gas, sputtering of a silicon (Si) target to form the second subset of layers.

15. The method of claim 13, wherein:
the gas includes argon (Ar); and
a stress of the first subset of layers is between 0 and 800 megapascals.

16. The method of claim 13, wherein:
the gas includes helium (He); and
a stress of the first subset of layers is between 0 and 150 megapascals.

17. The optical interference filter of claim 1, wherein a stress of the AlN material is greater than 0 megapascals.

18. The method of claim 13,
wherein the gas is an inert gas that includes at least one of argon (Ar) or helium (He),
wherein the method further comprises:
supplying nitrogen (N$_2$) gas to the chamber, and
wherein forming the set of layers comprises:
causing, based on supplying the inert gas and the N$_2$ gas, sputtering of an aluminum (Al) target to form the first subset of layers.

19. The method of claim 13, wherein forming the set of layers comprises:
using a magnetron sputtering process to sputter one or more of the first subset of layers or the second subset of layers on a substrate of the optical interference filter.

20. The method of claim 13, wherein forming the set of layers comprises:
forming, on a substrate, the first subset of layers in alternation with the second subset of layers.

* * * * *